United States Patent
Streck et al.

(10) Patent No.: US 7,307,026 B2
(45) Date of Patent: Dec. 11, 2007

(54) METHOD OF FORMING AN EPITAXIAL LAYER FOR RAISED DRAIN AND SOURCE REGIONS BY REMOVING CONTAMINATIONS

(75) Inventors: Christof Streck, Coswig (DE); Guido Koerner, Dresden (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 471 days.

(21) Appl. No.: 10/786,388

(22) Filed: Feb. 25, 2004

(65) Prior Publication Data

US 2005/0026367 A1  Feb. 3, 2005

(30) Foreign Application Priority Data

Jul. 31, 2003  (DE) ................. 103 35 102

(51) Int. Cl.
*H01L 21/302* (2006.01)
*H01L 21/31* (2006.01)

(52) U.S. Cl. .................. 438/746; 438/747; 438/756; 438/770

(58) Field of Classification Search ............... 438/746, 438/747, 756, 770
See application file for complete search history.

(56) References Cited

U.S. PATENT DOCUMENTS

| | | | |
|---|---|---|---|
| 6,437,417 B1 * | 8/2002 | Gilton | 257/506 |
| 6,448,167 B1 * | 9/2002 | Wang et al. | 438/595 |
| 6,509,241 B2 | 1/2003 | Park et al. | 438/303 |
| 6,725,119 B1 * | 4/2004 | Wake | 700/121 |
| 6,830,628 B2 * | 12/2004 | Bergman | 134/3 |
| 2001/0029074 A1 * | 10/2001 | Tsukamoto | 438/199 |
| 2001/0039123 A1 * | 11/2001 | Funabashi | 438/745 |
| 2002/0119647 A1 * | 8/2002 | Riley et al. | 438/595 |
| 2002/0146888 A1 * | 10/2002 | Ryu et al. | 438/300 |

OTHER PUBLICATIONS

Material Safety Data Sheet, Hydrogen Peroxide Solution; http://www.jtbaker.com/msds/englishhtml/H4065.htm, no date.*

* cited by examiner

*Primary Examiner*—Binh X. Tran
(74) *Attorney, Agent, or Firm*—Williams, Morgan & Amerson, P.C.

(57) ABSTRACT

According to the present invention, a wet chemical oxidation and etch process cycle allows efficient removal of contaminated silicon surface layers prior to the epitaxial growth of raised source and drain regions, thereby effectively reducing the total thermal budget in manufacturing sophisticated field effect transistor elements. The etch recipes used enable a controlled removal of material, wherein other device components are not unduly degraded by the oxidation and etch process.

10 Claims, 5 Drawing Sheets

METHOD OF FORMING AN EPITAXIAL LAYER FOR RAISED DRAIN AND SOURCE REGIONS BY REMOVING CONTAMINATIONS

BACKGROUND OF THE INVENTION

1. Field of the Invention

The present invention generally relates to the fabrication of integrated circuits, and, more particularly, to the formation of raised drain and source regions by means of epitaxial growth.

2. Description of the Related Art

Presently, critical feature sizes of circuit elements of sophisticated integrated circuits are approaching 0.1 µm and less, wherein, in the field of CMOS production, one important design dimension in this respect is the gate length of corresponding field effect transistor elements. A field effect transistor comprises a gate electrode formed on a gate insulation layer that electrically insulates the gate electrode from a channel region yet also provides a required capacitive coupling so as to enable proper control of the channel formation that is initiated upon applying an appropriate control voltage to the gate electrode. The channel region connects two heavily doped regions, which are referred to as the source region and the drain region, that form the required PN junction, wherein a distance between the drain and source regions is denoted as the "channel length." The channel length roughly corresponds to the gate length, as the gate electrode is used in the presently preferred CMOS technology as an implantation mask to form the drain and source regions in a self-aligned manner. The demand for fast operating integrated CMOS circuits, or any other integrated circuits, requires the reduction in size of the involved circuit elements, especially of the field effect transistors, as these transistor elements are usually operated in a switched mode, wherein the switching speed is significantly determined by parasitic capacitances and parasitic resistances of the transistor elements. By reducing, for instance, the channel length, and thus the gate length, of the transistor elements, a significant improvement with respect to signal processing performance may be obtained along with other advantages, such as increased package density, and thus increased functionality, of the integrated circuit. The steady decrease of the transistor dimensions, however, entails a plurality of issues that have to be dealt with so as to not unduly offset the advantages achieved by the size reduction of the circuit elements. For instance, the reduced feature sizes may also lead to reduced cross-sectional areas of lines and contact regions, thereby requiring increased dopant concentrations or other measures so as to maintain a required conductivity. Another issue arises from the fact that, as a general rule, a reduced gate length of a transistor also requires a reduced thickness of the gate insulation layer and shallow dopant profiles of the drain and source regions to provide the required controllability of the inversion channel.

With reference to FIGS. 1a–1c, some of the issues associated with the extreme size reduction of field effect transistors will now be described in more detail. In FIG. 1a, a field effect transistor 100 comprises a substrate 101, such as a silicon substrate or a silicon-on-insulator (SOI) substrate, having formed thereon a crystalline silicon region 103 that is frequently referred to as the "active region." The active region 103 is enclosed by an isolation structure 102, which is frequently provided in sophisticated transistor elements in the form of a trench isolation structure. A gate electrode 104 is formed above the active region 103 and is separated therefrom by a gate insulation layer 105. The gate electrode 104 may be comprised of doped polysilicon 106 and a metal silicide region 107 that may be comprised of, for instance, cobalt disilicide. Adjacent to the gate electrode 104, sidewall spacers 108 are located and are formed, for instance, of silicon nitride with a liner 109, for instance formed of silicon dioxide, disposed between the sidewalls of the gate electrode 104 and the upper surface of the active region 103 and the sidewall spacers 108. The active region 103 further comprises source and drain regions 110, wherein the dopant profile towards the gate electrode becomes shallower and corresponding portions 111 are frequently referred to as "extensions." Metal silicide regions 112, typical comprised of cobalt disilicide in modem transistor elements, are formed within the drain and source regions 110.

A typical process flow for manufacturing the transistor 100 as depicted in FIG. 1a may comprise the following processes. After formation of the trench isolation structures 102 by sophisticated lithography, etch and deposition techniques followed by a chemical mechanical polishing (CMP) sequence, an implantation cycle may be performed so as to provide a required vertical dopant profile within the active region 103. Corresponding processes are well established in the art and a detailed description is thus omitted herein. Thereafter, the gate insulation layer 105 may be formed by sophisticated oxidation and/or deposition techniques, followed by the formation of the gate electrode 104, which is typically formed by patterning a polysilicon layer by means of advanced lithography and etch techniques. A first implantation cycle may be carried out to form the extensions 111, and, subsequently, the liners 109 may be formed by, for example, an oxidation process. Next, the sidewall spacers 108 may be formed so as to serve as an implantation mask for forming the drain and source regions 110. The actually performed implantation cycles may include a plurality of implantation steps, for instance including tilted implantation sequences, so as to obtain the required complex dopant profile for the drain and source regions 110 and the extension 111. Thereafter, one or more anneal cycles are carried out so as to activate the dopants implanted into the active region 103 and to, at least partially, re-crystallize portions of the active region 103 damaged by the preceding ion implantation sequence. Since relatively high temperatures are necessary to activate the dopants, the anneal cycles are accompanied by increased diffusion of the dopants, thereby significantly affecting the finally obtained dopant profile. As the transistor dimensions are steadily reduced, the final dopant concentrations have, however, to be precisely controlled during the manufacturing process of the transistor 100 so as to assure the required transistor performance. For instance, as the channel length decreases, ie., the lateral distance of the extensions 111 in FIG. 1a, extensive lateral diffusion is to be precisely controlled. Thus, a so-called thermal budget is established that sets forth the maximum amount of heat treatments that may be applied to the transistor during fabrication without causing unacceptable diffusion of the various doped regions over time during the manufacturing process of the transistor device 100. Consequently, the thermal budget for the transistor 100 should be maintained as low as possible to not unduly "smear" the dopant profile and, hence, compromise the transistor characteristic.

Thereafter, the silicide regions 112 and 107 (see FIG. 1a) may be formed so as to significantly lower the contact resistance of the drain and source regions 110 as well as the line resistance of the gate electrode 104. As previously explained, in sophisticated transistor elements, extremely shallow dopant profiles for the extensions 111 and the drain and source regions 110 are required that, in turn, restricts the available depth to which the silicide regions 112 may be formed. Furthermore, since the silicide regions 112 and 107 are typically formed simultaneously in a self-aligned manner, the depth restriction with respect to the silicide regions 112 also affects the finally obtained depth of the region 107 in the gate electrode 104, and thus significantly influences the degree of conductivity improvement achieved in the gate electrode 104.

Typically, a cobalt layer is deposited and a heat treatment is performed so as to initiate a chemical reaction, thereby forming cobalt silicide at device regions containing silicon, whereas a reaction of cobalt with the sidewall spacers 108 and the isolation structures 102 is substantially prevented. Thereafter, the non-reacted cobalt is selectively removed and a further heat treatment is performed so as to convert the relatively high ohmic cobalt silicide into a stable and highly conductive cobalt disilicide.

As explained above, the reduced depth of the drain and source regions 110 may not allow the formation of sufficiently dimensioned metal silicide regions 112 and 107 so as to provide the required low contact resistance and sheet resistance, respectively.

As shown in FIG. 1b, a different approach is, therefore, frequently employed. Here, prior to the formation of the metal silicide regions 112, 107, an epitaxial growth process is performed so as to selectively increase the thickness of exposed silicon areas, while substantially not affecting the isolation structure 102 and the sidewall spacers 108. As shown, additional silicon regions 113 are formed above the drain and source regions 110 and a corresponding silicon region 114 may be formed on top of the polysilicon gate 104. Finally, a silicidation process is performed as is described with reference to FIG. 1a. The silicide thickness stays the same, thus enabling the silicon thickness of SOI substrate wafers to be decreased. It turns out, however, that the epitaxial growth as shown in FIG. 1b is sensitively influenced by the surface quality of the drain and source regions 110. It has been found that a moderately large amount of contamination, for instance carbon and oxygen atoms, are incorporated in a surface region 115 (see FIG. 1b) of the drain and source regions 110, which substantially prevent an effective growth process for forming the additional silicon regions 113. This is particularly true for the different substrates in CMOS technology, i.e., NMOS and PMOS areas. Conventionally, the transistor 110 is subjected to an anneal cycle at temperatures above 1000° C. in a hydrogen atmosphere so as to remove the contamination from the surface region 115, thereby improving the surface quality to a degree that allows successful growth of the regions 113. The elevated temperatures applied during the anneal cycle prior to the epitaxial growth process, however, significantly contribute to the thermal budget of the transistor 100, thereby significantly deteriorating the dopant profile of the drain and source regions 110 and the extensions 111.

The deterioration of the dopant profile may thus limit further device scaling, although the approach of raised silicide regions on the drain and source regions 110 offers the potential to significantly reduce the contact and sheet resistance of the corresponding silicon regions.

In view in of the above-identified problems, a need exists to provide an improved technique that enables the formation of raised drain and source regions without unduly deteriorating the thermal budget during the transistor fabrication.

SUMMARY OF THE INVENTION

Generally, the present invention is directed toward a technique to reduce a surface portion of the drain and source regions of a transistor, in which contaminations hindering the epitaxial growth of silicon are incorporated, without unduly adversely affecting other transistor components. To this end, a wet chemical etch process is performed to remove the silicon layer on the drain and source regions to a required depth so as to substantially remove contaminations contained therein. Hereby, the etch chemistry is selected so as to provide a high degree of controllability during the removal of the contamination layer and/or provide a high degree of selectivity so as to not unduly affect sensitive circuit components, such as sidewall spacer structures, that are also exposed to the etch chemistry. Thus, the thermal budget of the selective epitaxial growth process and hence the total thermal budget may be significantly reduced compared to the conventional approach, as previously described.

According to one illustrative embodiment of the present invention, a method comprises forming doped regions of a specified doping profile in a silicon region adjacent to a gate electrode having sidewall spacers formed thereon. A surface layer of the doped regions is removed by performing an etching process using a diluted etch solution. Finally, a silicon layer is epitaxially grown on the doped regions after the surface layer is removed.

According to another illustrative embodiment of the present invention, a method comprises the formation of doped regions of a specified dopant profile in a silicon region adjacent to a gate electrode having sidewall spacers formed thereon. Furthermore, a surface layer of the doped regions is removed by using a diluted etch solution comprising hydrogenated fluorides, hydrogen peroxide and water. Finally, a silicon layer is epitaxially grown on the doped regions.

According to a still further illustrative embodiment of the present invention, a method comprises the formation of doped regions of a specified dopant profile in a silicon region adjacent to a gate electrode having sidewall spacers formed thereon. A surface layer of the doped regions is removed by using a diluted etch solution comprising ammonium hydroxide ($NH_4OH$), hydrogen peroxide and water. Finally, a silicon layer is epitaxially grown on the doped regions. In one particular embodiment, an HF (hydrogenated fluoride) rinse is applied prior to the epitaxial growth to form Si—H bonds on the surface, thereby leaving the surface hydrophobic and thus substantially preventing native oxide growth.

According to a still further illustrative embodiment of the present invention, a method comprises the formation of doped regions of a specified dopant profile in a silicon region adjacent to a gate electrode having sidewall spacers formed thereon. A surface layer of the doped regions is oxidized by a diluted oxidizing solution that comprises sulfuric acid and hydrogen peroxide. Thereafter, the oxidized surface layer is removed by using a diluted etch solution comprising hydrogenated fluorides. Finally, a silicon layer is epitaxially grown on the doped regions.

BRIEF DESCRIPTION OF THE DRAWINGS

The invention may be understood by reference to the following description taken in conjunction with the accompanying drawings, in which like reference numerals identify like elements, and in which.

Figure 1A:
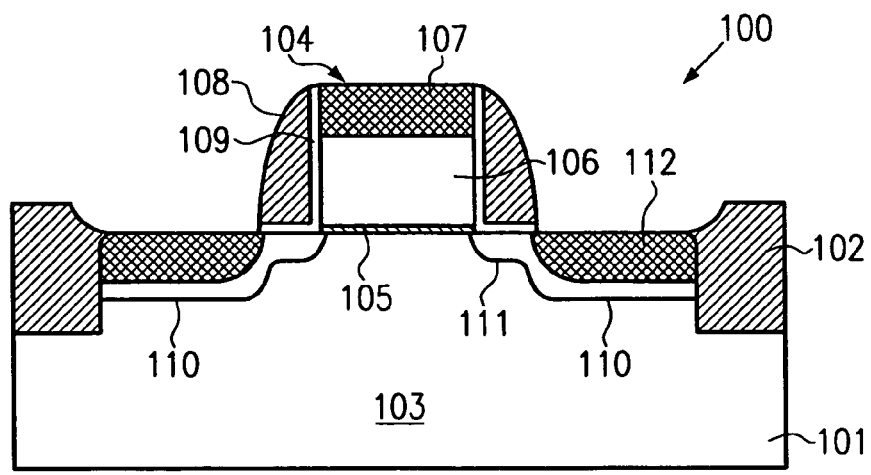
FIGS. 1a–1c schematically illustrate cross-sectional views of a field effect transistor during various manufacturing stages in accordance with a conventional approach for forming raised drain and source regions.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the under-standing of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2A:
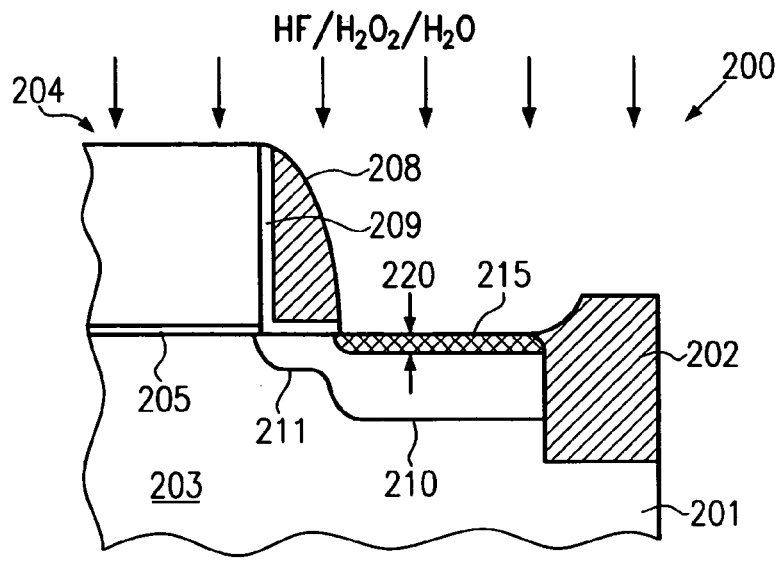
FIGS. 2a–2e schematically show cross-sectional views of a portion of a transistor element, wherein a surface layer is removed so as to enhance the epitaxial growth of silicon in accordance with illustrative embodiments of the present invention.

With reference to FIGS. 2a–2e, further illustrative embodiments of the present invention will be described in more detail. FIG. 2a schematically shows a portion of a transistor element 200 that comprises a substrate 201, a substantially crystalline region 203, and a gate electrode 204 separated from the silicon region 203 (which is also referred to as an active region) by a gate insulation layer 205. Sidewall spacers 208, for instance comprised of silicon nitride, are formed on sidewalls of the gate electrode 204 and separated therefrom by a liner 209, which may be comprised of silicon dioxide. The active region 203 is enclosed by an isolation structure 202. Doped regions 210, provided as drain and source regions (for convenience, only one region is illustrated in FIG. 2a), are formed within the active region 203 with respective extensions 211 connecting to a channel region located below the gate insulation layer 205. Furthermore, a surface layer 215 of the drain and source regions 210 (and possibly on the gate electrode 204) may contain contaminating impurities, such as carbon and oxygen, up to a certain depth 220.

A typical process flow for forming the transistor element 200 as shown in FIG. 2a may comprise substantially the same processes as already described with reference to FIGS. 1a–1b. In particular, the contamination in the surface layer 215 may be caused by preceding processes, such as etch procedures, implantation cycles and the like, that finally resulted in contaminating the surface layer 215. In one illustrative embodiment of the present invention, therefore, the depth 220 is determined so as to estimate the required material removal prior to the subsequent epitaxial growth step. A corresponding determination of the penetration depth 220 may be performed on the basis of test wafers having experienced the same process sequence as product substrates, or on the basis of test sites of product substrates. Corresponding measurement data may be gathered by any appropriate measurement method such as optical measurements, electron microscopy, and the like. For a typical CMOS technology employed for transistor elements having critical feature sizes beyond 0.1 µm, the penetration depth 220 may range from approximately 20–30 Å. Thus, process parameters for removing the contaminated surface layer 215 are advantageously controlled on the basis of the measurement results obtained so as to reliably remove contaminations that may hinder an efficient epitaxial growth. Although excessive material removal of the surface layer 215 may be acceptable, a determination of the actual depth 220 and a corresponding control of the removal may be advantageous in some embodiments in view of a reduced influence on other components.

Prior to applying a corresponding etch recipe to the device 200, oxide residues may be removed similarly as in conventional approaches, wherein, prior to the deposition of cobalt, the exposed silicon surfaces are cleaned so as to promote an efficient cobalt and silicon inter-diffusion upon forming cobalt silicide. According to the present invention, respective clean recipes for removing oxide residues may be used so as to efficiently remove oxides from the surface of the contamination layer 215 and the gate electrode 204. For instance, a hydrogenated fluoride dip may be used to remove oxide, wherein the duration of the treatment is moderately short to sufficiently remove oxide residues without unduly affecting the liner 209 and the isolation structures 202.

Thereafter, a process is performed to remove the contamination layer 215. According to one particular embodiment, this is accomplished by exposing the device 200 to a diluted hydrogenated fluoride/hydrogen peroxide ($HF/H_2O_2$) mixture, which is applied by a spray tool. Any appropriate spray tool known in the art may be used that is suitably equipped to provide the above-identified chemicals. In other embodiments, the device 200 may be introduced into a bath containing the above-identified chemicals. The hydrogenated fluoride/hydrogen peroxide mixture is strongly diluted so as to provide the required controllability of the etch process. For instance, approximately 700–900 parts per volume water may be used with 10–20 parts per volume of hydrogenated fluoride/hydrogen peroxide. In some embodiments, the ratio (parts per volume) of hydrogenated fluoride and hydrogen peroxide is in the range of approximately 1:5 to 1:15. In one exemplary embodiment, the ratio of hydrogenated fluoride/hydrogen peroxide/water may be selected to be approximately 1:10:800, resulting in an etch rate of approximately 1 Å silicon per minute at room temperature. Thus, if, for example, 30 Å of contaminated silicon of the surface layer 215 has to be removed, with the above-specified ranges, an etch time of approximately 20–40 minutes may be required. After the actual etch step, a rinse step followed by a dry step may be performed so as to prepare the surface for the following epitaxial growth. In other embodiments, the application of the diluted etch solution may be carried out intermittently with a corresponding rinse or cleaning step so as to enhance the etch uniformity due to the periodic removal of etch byproducts.

Figure 2B:
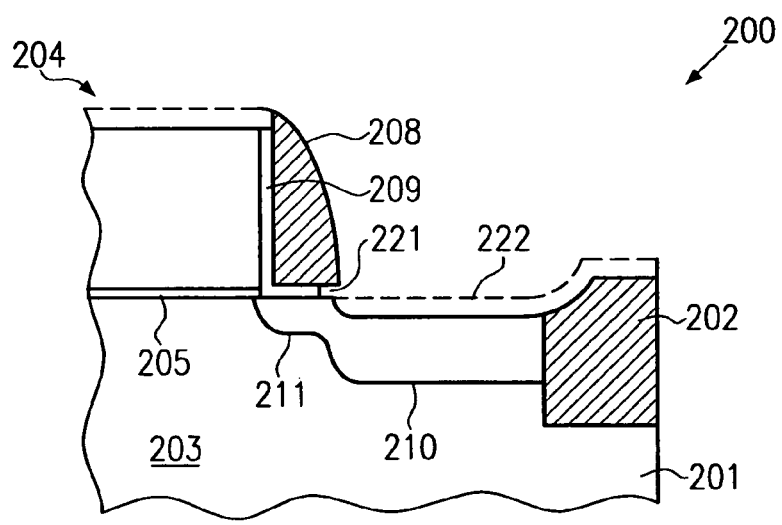

FIG. 2b schematically shows the transistor device 200 after completion of the etch process, wherein the contaminated surface layer 215 is substantially removed from the drain and source regions 210. The removed portions are shown in phantom lines and are indicated as 222. A portion of the gate electrode 204 is also removed. Since the etch chemistry used in FIG. 2a is substantially not selective to silicon dioxide, corresponding portions may also be removed from the isolation structure 202 and the liner 209. This may lead to a certain amount of under-etch 221 at the foot of the sidewall spacer 208. Since the under-etch 221 is, at most, of the same order of magnitude as the material removal, and thus the thickness 220, any inadvertent effect of the etch process is negligible. In some embodiments, when the under-etch 221 may be considered inappropriate, the magnitude thereof may be reduced by performing a heat treatment after a first etch step with the above-identified chemistry so as to drive lower-lying contamination substances to the surface exposed by the first etch stop so as to reduce the actual thickness to be removed in a subsequent etch step. In this way, the effective thickness 220 that has to be removed may be reduced, thereby also decreasing the resulting under-etch 221. In this heat treatment, a significantly lower temperature may be applied than is necessary in the conventional approach requiring a complete contamination removal over the entire depth 220 at temperatures well above 1000° C. Consequently, the total thermal budget is not unduly increased.

Figure 1B:
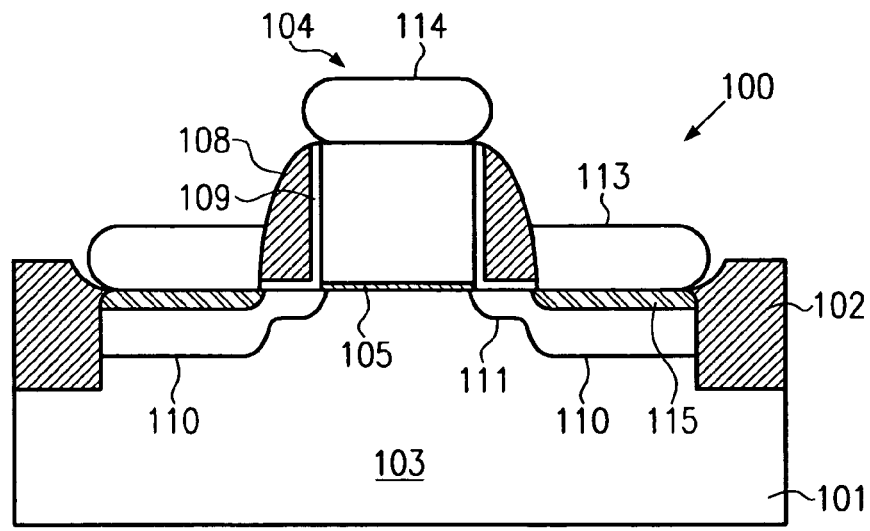

After the material removal by the above-identified wet etch sequence, a silicon region is epitaxially grown as is described with the conventional approach in FIG. 1b.

Figure 1C:
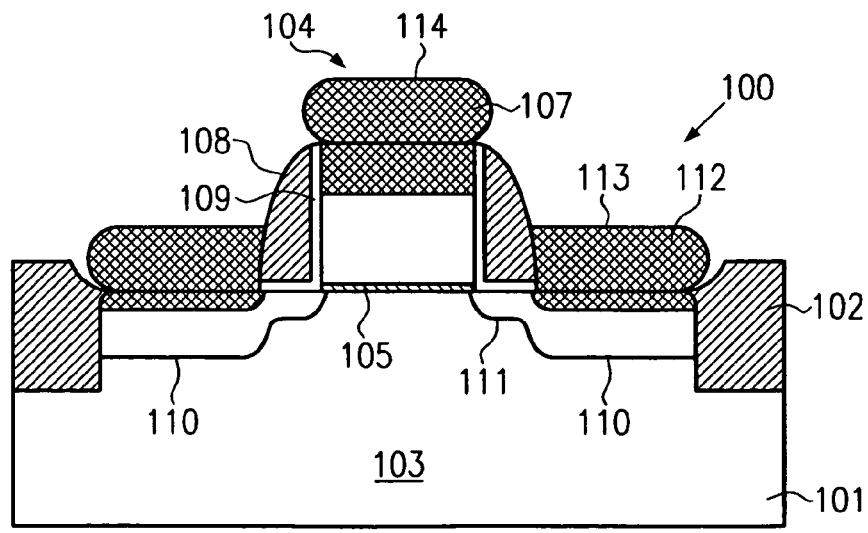
Figure 2C:
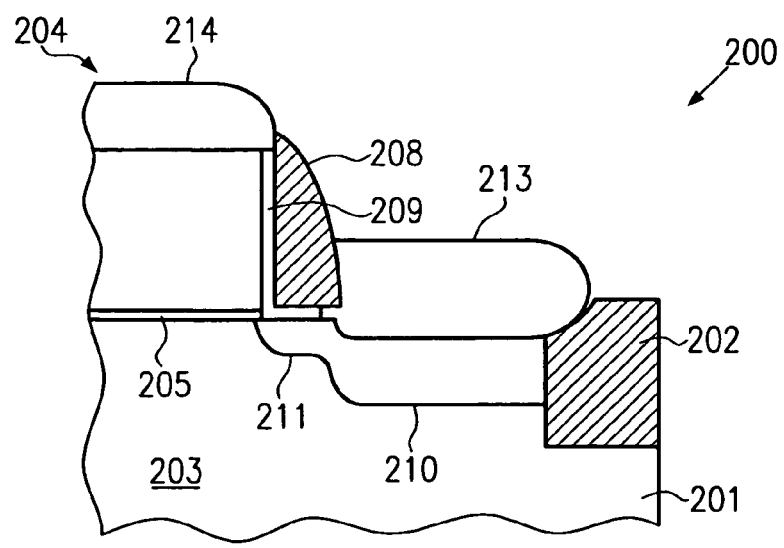

FIG. 2c schematically shows the transistor device 200 after the epitaxial growth to provide additional silicon portions 213 and 214 above the drain and source regions 210 and the gate electrode 204. Thereafter, further processing may be resumed as described with reference to FIG. 1c, so as to form a metal salicide in the silicon portions 213 and the drain and source regions 210, as well as the portion 214 and the underlying gate electrode 204.

Figure 2D:
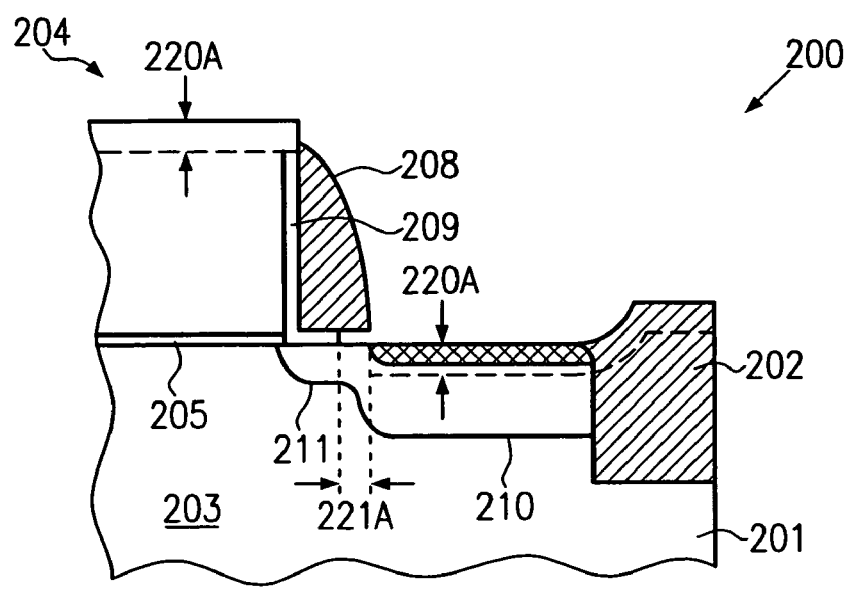

FIG. 2d schematically shows a further illustrative embodiment, in which the under-etch during the removal of the surface layer 215 is intentionally controlled so as to adjust a lateral extension of the finally obtained metal silicide regions on the drain and source regions 210. To this end, a removal depth 220a is determined, which will result in a desired under-etch 221a after completion of the wet etch process that may be performed in accordance with any of the embodiments described above. For instance, it may be desirable to increase the lateral extension of the finally obtained metal silicide region to approximately 5–6 nm, resulting in an overall increase of 10–12 nm for the device 200 so that the corresponding target etch depth 220a may be selected to be correspondingly larger, thereby taking into account the possibly slightly differing etch rates for silicon and silicon dioxide. Additionally, the height of the sidewall spacer 208 may be decreased so as to substantially avoid any protrusions of the sidewall spacer 208 after removing material from the topside of the electrode 204 and the liner 209. The reduction of the sidewall spacer height may be achieved by correspondingly providing an over-etch time during the anisotropic etch process for forming the sidewall spacers 208. In a further embodiment, the height of the sidewall spacer 208 may be reduced significantly more than the etch depth 220a so as to expose the liner 209 on the sidewalls of the gate electrode 204. During the subsequent etch process, using the diluted hydrogenated fluoride/hydrogen peroxide solution, an enlarged sidewall portion of the gate electrode 204 is exposed and is then available for the subsequent metal silicide formation.

The desired under-etch 221a as obtained after the etch process provides for an increased silicon portion in the subsequent epitaxial growth step.

Figure 2E:
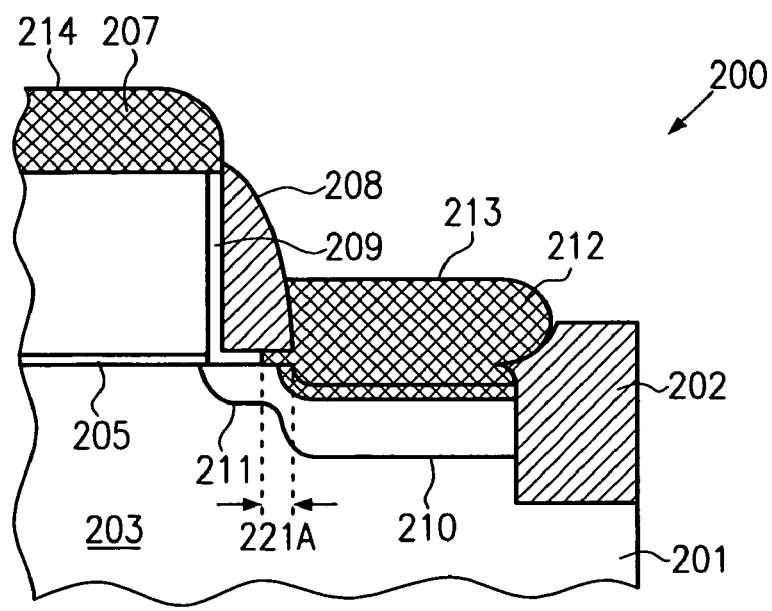

FIG. 2e schematically shows the resulting transistor device 200 after formation of metal silicide regions 212 and 207 having a desired increased lateral extension due to the provision of the under-etch area 221a. Consequently, by correspondingly controlling the etch process with respect to a desired under-etch 221a, the lateral extension of the metal silicide region 212 and thus the contact resistance thereof may be controlled within a range provided by the width of the sidewall spacer 208.

Figure 3A:
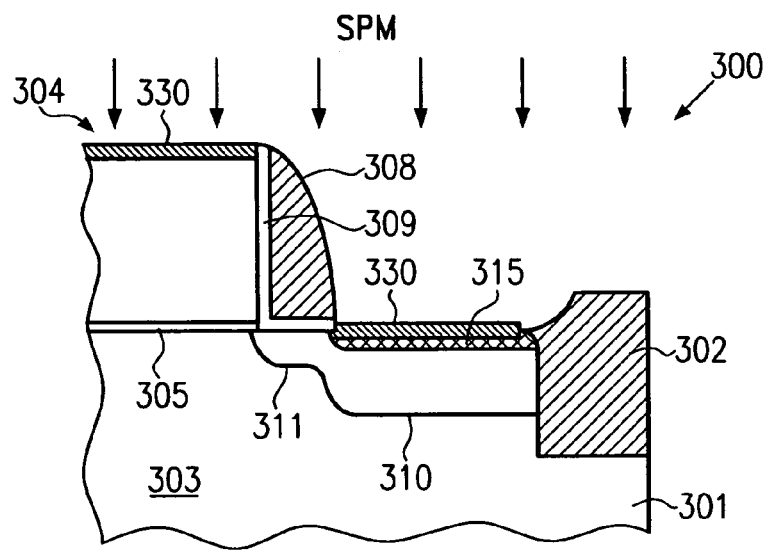
FIGS. 3a–3c schematically show a portion of a transistor element, in which a contaminated surface region is removed according to further illustrative embodiments of the present invention.
Figure 3B:
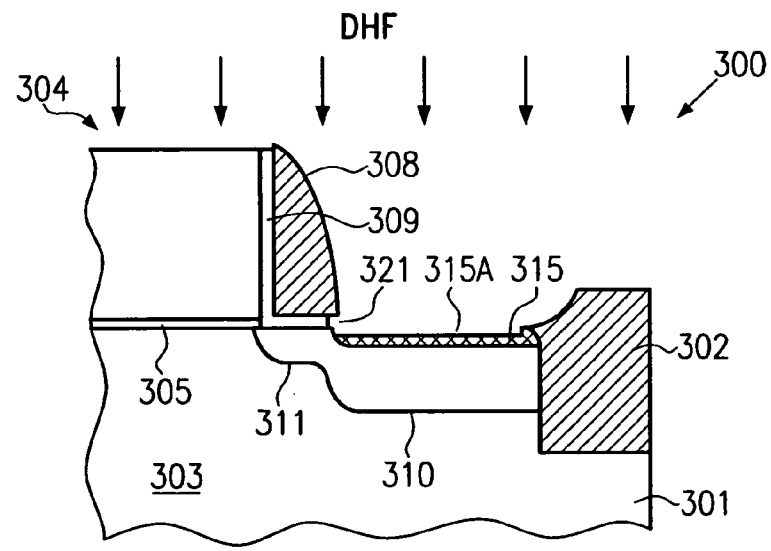
Figure 3C:
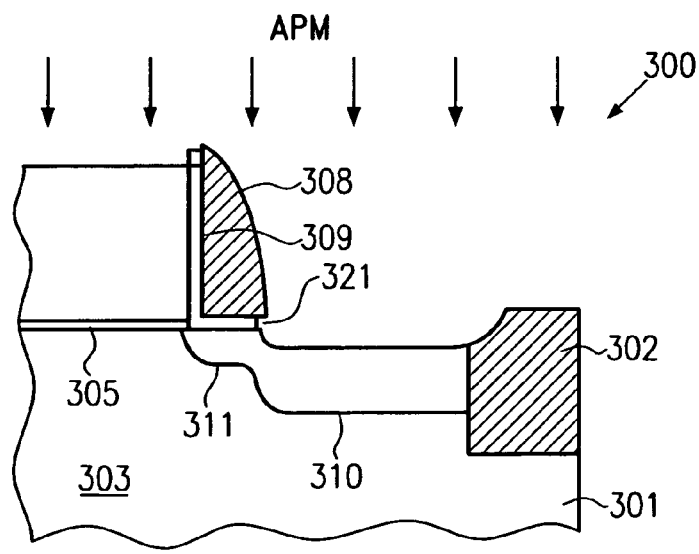

With reference to FIGS. 3a–3c, further illustrative embodiments of the present invention will now be described. In FIG. 3a, a portion of a transistor element 300 is illustrated, wherein the components are denoted by the same reference numbers as in FIG. 2a, with the exception that a "3" is used as the first number instead of a "2." The transistor element 300 may be formed in accordance with processes as already described with reference to FIG. 1a or 2a. Moreover, a depth of the contaminated surface layer 315 may have been determined in advance to correspondingly control an etch process for removing the layer 315. Prior to the actual removal process, any oxide residues on the surfaces of the drain and source regions 310 and the gate electrode 304 may be removed by any appropriate process, as is, for example, described with reference to FIG. 2a. Thereafter, the transistor element 300 is exposed to an oxidizing solution, which, in one particular embodiment, is comprised of sulfuric acid/hydrogen peroxide ($H_2SO_4$/$H_2O_2$), which is frequently referred to as "SPM." A typical mixture ratio of the SPM solution may be in the range of approximately 5:1 to 15:1, wherein a temperature of the solution and the substrate 301 is maintained within a range of approximately 100–140° C. In one exemplary embodiment, the mixture ratio (parts per volume) of SPM is approximately 10:1, which is provided at a temperature of approximately 120° C. The oxidation process is self-limiting, thereby creating approximately 5–8 Å of oxide. FIG. 3a depicts a corresponding silicon dioxide layer 330 that has consumed a portion of the contamination layer 315. Consequently, only a portion 330 of the contaminated layer 315 is oxidized and removed by diluted hydrogenated fluoride. For instance, a mixture ratio from about 1:100–1:800, e.g., approximately 1:300 (HF/H$_2$O) may be used to obtain an oxide etch rate of approximately 1 Å per 10–15 seconds at room temperature. An APM rinse (as described below) may be introduced in between the oxidation and etch process to remove possible traces of sulfuric residuals (e.g., Si-sulfones).

FIG. 3b shows the transistor 300 after the oxide etch step, wherein the portion 330 is removed from the gate electrode 304 and the drain and the source regions 310. A certain under-etch 321 may occur at the foot of the sidewall spacer 308, owing to the silicon dioxide 309. Thus, the contaminated surface layer 315 is reduced in thickness by the silicon consumed by the oxidation process and is now denoted as 315a. A corresponding process cycle, i.e., oxidation and subsequent oxide etch as described with reference to FIGS. 3a–3b, may be repeated until the initial contaminated layer 315 is substantially completely removed. Removing the contaminated material by a repeated sequence of oxidation and oxide etch may be advantageous in enhancing the removal uniformity. In other embodiments, a single oxidation step followed by a single etch step may also be deemed appropriate. It should be noted that the oxide removal, for example, at the isolation structures 302 is negligible and does not negatively influence the device's characteristics. The same holds for the under-etch 321.

FIG. 3c schematically shows the transistor 300 after completion of the above-described oxidation and oxide etch cycle, wherein the layer 315 is substantially completely removed so as to leave a slightly reduced gate electrode 304 and a corresponding under-etch 321 at the foot of the sidewall spacer 308. As shown, a final cleaning step may be performed, for instance, by applying a diluted ammonium hydroxide/hydrogen peroxide solution, which is also referred to as "APM," possibly in combination with the supply of ultrasonic energy to clean the remaining surface from particles and remaining chemistry, especially from the oxidizing SPM. For instance, a ratio of approximately 1:1:5 to 1:20:100 (NH$_4$OH/H$_2$O$_2$/H$_2$O) may be used for approximately 20–40 seconds at a temperature of approximately 60° C. Subsequently, the transistor element 300 may be subjected to epitaxial growth and silicidation processes as previously described with reference to FIGS. 2a–2e.

Regarding the under-etch 321, it should be noted that the corresponding size thereof may be controlled by adjusting the oxide-etch time with diluted hydrogenated fluoride so that a lateral extension of the finally obtained silicide regions may be adjusted in a similar manner as described with reference to the aforementioned embodiments. Similarly, the height of the sidewall spacer 308 may be decreased by a corresponding over-etch during the anisotropic etch process during the formation of the spacers 308 so as to expose the liner 309 at upper sidewall portions. Due to the selectivity of the diluted hydrogenated fluoride etch process, the exposed liner 309 may be removed and the silicon of the gate electrode 304 at the side-walls thereof may be effectively exposed prior to the epitaxial growth and the subsequent silicidation process, thereby effectively increasing the surface area of the gate electrode 304 that is available for forming a highly conductive metal silicide.

Figure 4:
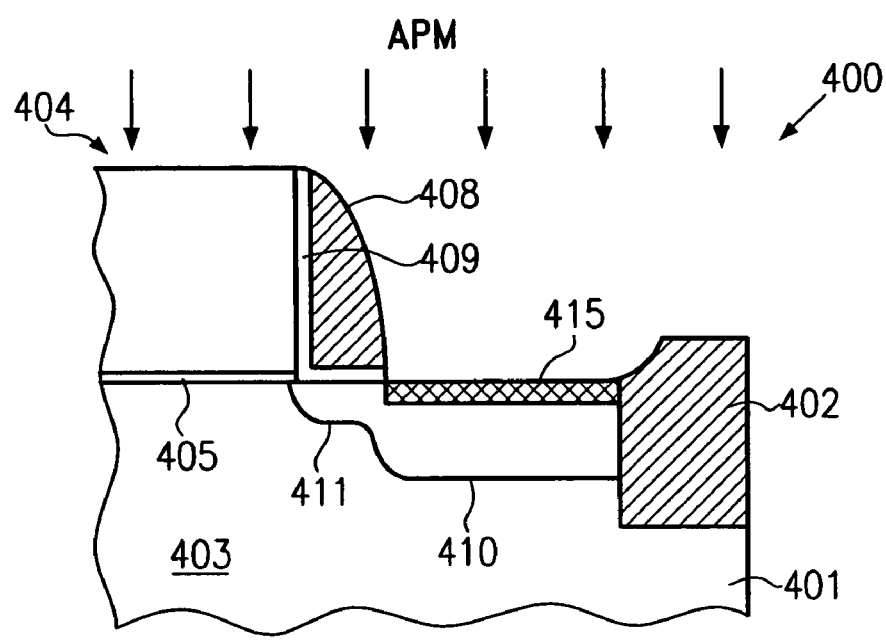
FIG. 4 schematically shows the removal of a contaminated surface portion in accordance with still another illustrative embodiment of the present invention.

FIG. 4 schematically shows a further illustrative embodiment, wherein a corresponding contaminated silicon layer 415 is removed by a wet chemical etch process. Similar components compared to FIGS. 1, 2 and 3 are indicated by the same reference numerals, except for the first digit. The transistor device 400 comprises the contaminated surface layer 415, which is subjected to a bath comprising diluted ammonium hydroxide/hydrogen peroxide (APM), wherein the APM is highly diluted, containing water in the approximate range of 80–120 parts per volume and approximately 20 parts per volume ammonium hydroxide and hydrogen peroxide, wherein a ratio of ammonium hydroxide and hydrogen peroxide is in the range of 1:15 to 1:25. In one particular embodiment, the temperature of the APM supplied to the transistor element 400 is in the range of approximately 50–70° C. and may be set to, for example, 60° C. The APM may be applied in the form of a bath or may be supplied by a spray tool. Within the above-specified value ranges, an etch rate for silicon of approximately 0.8–1.2 Å per minute may be achieved. As pointed out with reference to FIGS. 2a–2e, a corresponding clean sequence may precede the actual APM etch process step so as to remove oxide residues from the exposed surfaces. During the etch step with the APM solution according to the present invention, a reduced etch rate is obtained, thereby providing a superior control of the etch process, wherein a relatively high selectivity to oxide is achieved and furthermore pitting effects on the exposed silicon may be efficiently suppressed. The thickness of the removed contaminated silicon layer 415 may be readily adjusted to the process requirements by correspondingly selecting the etch time in the APM bath. Finally, an HF rinse (conc. 1:100 to 1:800 for 10–100 sec) may be applied to remove the OH-groups from the silicon surface and creating Si—H bonds.

As a result, the present invention provides an improved technique to effectively reduce the thermal budget in the manufacturing of transistor devices in that a contaminated silicon layer is removed by a wet chemical etch procedure, thereby eliminating or at last reducing elevated temperature prior to the epitaxial growth process. The influence of the wet chemical etch process on other device components, such as the sidewall spacer structure, does not substantially adversely affect the characteristics thereof. In some embodiments, the effect of the wet chemical etch process may even be used to control the lateral extension of respective silicide regions on the drain and source regions. Moreover, if desired, an increased sidewall area of the gate electrode may be exposed prior to the epitaxial growth process and the subsequent silicidation process. Hence, in some embodiments, the influence of the wet chemical etch process may positively be used to obtain superior device characteristics in terms of electrical conductivity of the gate electrode and/or the drain and source contact.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming doped regions of a specified doping profile in a silicon region adjacent to a gate electrode having sidewall spacers formed thereon;
    performing a first oxidation process to form a first oxidized portion of said doped regions;

performing a first etching process to remove said first oxidized portion of said doped regions;

after removing said first oxidized portion of said doped regions, performing a heat treatment process on said doped regions;

after performing said heat treatment process, performing a second oxidation process to form a second oxidized portion of said doped regions;

performing a second etching process to remove said second oxidized portion of said doped regions;

epitaxially growing a silicon layer on said doped regions after removing said second oxidized portion of said doped regions; and forming a metal silicide in said grown silicon layer.

2. The method of claim 1, wherein said first and second etching processes employ a diluted etch solution comprising hydrogenated fluoride (HF), hydrogen peroxide ($H_2O_2$) and water.

3. The method of claim 1, wherein said first and second etching processes employ a diluted etch solution comprising ammonium hydroxide and hydrogen peroxide (APM).

4. The method of claim 1, further comprising cleaning a surface of said doped regions prior to performing said first oxidation process.

5. The method of claim 2, wherein said first and second etching processes are performed using a spray tool.

6. A method, comprising:

forming doped regions of a specified doping profile in a silicon region adjacent to a gate electrode having sidewall spacers formed thereon;

performing a first oxidation process to form a first oxidized portion of said doped regions;

performing a first etching process to remove said first oxidized portion of said doped regions;

after removing said first oxidized portion of said doped regions, performing a heat treatment process on said doped regions;

after performing said heat treatment process, performing a second oxidation process to form a second oxidized portion of said doped regions;

performing a second etching process to remove said second oxidized portion of said doped regions; and epitaxially growing a silicon layer on said doped regions after removing said second oxidized portion of said doped regions.

7. The method of claim 6, wherein said first and second etching processes employ a diluted etch solution comprising ammonium hydroxide and hydrogen peroxide (APM).

8. The method of claim 6, further comprising cleaning a surface of said doped regions prior to performing said first oxidation process.

9. The method of claim 6, wherein said first and second etching processes employ a diluted etch solution comprising hydrogenated fluoride (HF), hydrogen peroxide ($H_2O_2$) and water.

10. The method of claim 9, wherein said first and second etching processes are performed using a spray tool.

* * * * *